(12) United States Patent
Kanai

(10) Patent No.: US 7,399,557 B2
(45) Date of Patent: Jul. 15, 2008

(54) PHOTOMASK CORRECTING METHOD AND MANUFACTURING METHOD OF SEMICONDUCTOR DEVICE

(75) Inventor: Hideki Kanai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 683 days.

(21) Appl. No.: 10/860,138

(22) Filed: Jun. 4, 2004

(65) Prior Publication Data
US 2004/0253525 A1 Dec. 16, 2004

(30) Foreign Application Priority Data
Jun. 5, 2003 (JP) ............... 2003-161038

(51) Int. Cl.
*G03F 1/00* (2006.01)
*G03C 5/00* (2006.01)

(52) U.S. Cl. ..................... 430/5; 430/394
(58) Field of Classification Search ........ 430/5, 430/394; 716/19–21
See application file for complete search history.

(56) References Cited

U.S. PATENT DOCUMENTS 6,787,459 B2 *  9/2004 Moniwa et al. ............. 438/671
6,821,683 B2 * 11/2004 Toyama et al. ................ 430/5

FOREIGN PATENT DOCUMENTS

| JP | 11-102062 | 4/1999 |
|---|---|---|
| JP | 11-174658 | 7/1999 |
| JP | 2002-311563 | 10/2002 |
| JP | 2002-359352 | 12/2002 |
| JP | 2003-015272 | 1/2003 |

OTHER PUBLICATIONS

Notification of Reasons for Rejection from Japanese Patent Office mailed Feb. 27, 2007 in Japanese Patent Application No. 2003-161038, and English translation thereof.

* cited by examiner

*Primary Examiner*—Stephen Rosasco
(74) *Attorney, Agent, or Firm*—Finnegan, Henderson, Farabow, Garrett & Dunner, L.L.P.

(57) ABSTRACT

A writing pattern data generating method for, in order to form a first photomask for use in a manufacturing method of a semiconductor device which including forming a first resist pattern on a mask film formed on a first film using the first photomask, forming a first mask pattern by etching the mask film, removing the first resist pattern, forming a second resist film on the mask film, forming a second resist pattern on the mask film, forming a second mask pattern by etching the mask film, removing the second resist pattern, and forming a first film pattern by etching the first film, the generating method comprising correcting a first pattern data in accordance with a difference between the first film pattern and the second mask pattern and a difference between the first resist pattern and the first mask pattern.

10 Claims, 17 Drawing Sheets

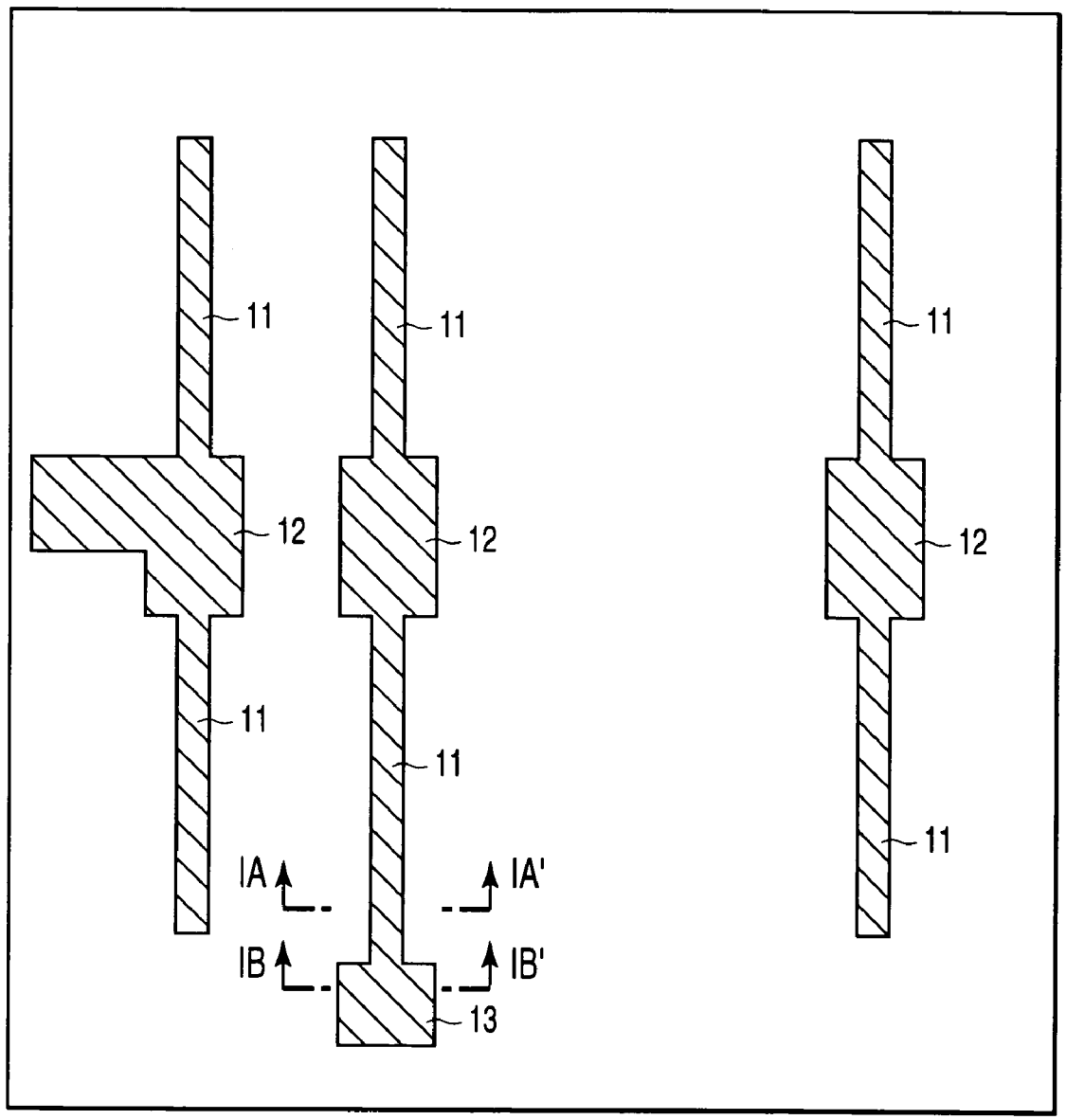
F I G. 1

PHOTOMASK CORRECTING METHOD AND MANUFACTURING METHOD OF SEMICONDUCTOR DEVICE

CROSS-REFERENCE TO RELATED APPLICATION

This application is based upon and claims the benefit of priority from prior Japanese Patent Application No. 2003-161038, filed Jun. 5, 2003, the entire contents of which are incorporated herein by reference.

BACKGROUND OF THE INVENTION

1. Field of the Invention

The present invention relates to a photo mask correcting method for use in a manufacturing method of a semiconductor device using a double transfer method and to a manufacturing method of a semiconductor device using a corrected photo mask.

2. Description of the Related Art

In recent years, in the manufacture of a semiconductor memory device, continued progress has been made to obtain a higher integration density unit including elements and connection lines in a circuit and attain more microminiaturization of a pattern involved. In the manufacture of an RISC processor, etc., used as a CPU for an engineering work station (EWS) and personal computer (PC), a demand has been made for attaining a pattern whose transistor gate width is below 100 nm for the year 2002.

Recently, a method has been disclosed in which, in order to obtain a more microminiaturized gate, a very small gate is formed relative to a resist pattern (See paragraphs [0032] to [0049], FIGS. 1 to 6 of JPN PAT APPLN KOKAI PUBLICATION 2002-359352). Here, the method disclosed in this KOKAI PUBLICATION is called a double transfer method.

First, a first resist pattern is formed using an alternating phase shift mask and, with this used as a mask, an underlying film is made slimmer. After the first pattern is removed, a resist is again coated on a surface and, by directing exposure light to a trimming mask, a second resist pattern is formed. After this, no slimming processing is applied to the underlying film or processing is done to a more slimming extent and, finally, a gate is formed. However, there is no disclosure in this KOKAI PUBLICATION as to how to very accurately form such an electrode of any desired dimensional width.

BRIEF SUMMARY OF THE INVENTION

In one aspect of a photomask correction method of the present invention, there is provided a writing pattern data generating method for, in order to form a first photomask for use in a manufacturing method of a semiconductor device, generating a first writing pattern data which allows a first photomask pattern to be written on a mask-blank from a first pattern data, the manufacturing method of the semiconductor device including forming a mask material film formed on a first film; forming a first resist film on the mask material film; forming a first resist pattern by transferring the first photomask pattern to the first resist film and developing the first resist film; forming a first mask pattern by etching the mask material film with the first resist pattern used as a mask; removing the first resist pattern, after forming the first mask pattern; forming a second resist film on the mask material film, after removing the first resist film; forming a second resist pattern by transferring a second photomask pattern which is formed on a second photomask to the second resist film and developing the second resist film, after removing the first resist pattern; forming a second mask pattern by etching the mask material film with the second resist pattern used as a mask; removing the second resist pattern, after forming the second mask pattern; and forming a first film pattern by etching the first film with a second mask pattern used as a mask, after removing the second resist pattern, the writing pattern data generating method comprising: correcting the first pattern data in accordance with a first formation change difference between the first film pattern and the second mask pattern which is produced dependent upon the pattern arrangement of the second mask pattern and a second formation change difference between the first resist pattern and the first mask pattern which is produced dependent upon the pattern arrangement of the first resist pattern.

In another aspect of a photomask correcting method of the present invention, there is provided a writing pattern data generating method for, in order to form a second photomask for use in a manufacturing method of a semiconductor device, generating a second writing pattern data which allows a second photomask pattern to be written on a mask-blank from second pattern data, the manufacturing method of the semiconductor device including forming a mask material film formed on a first film; forming a first resist film on the mask material film; forming a first resist pattern by transferring a first photomask pattern which is formed on a first photomask to the first resist film and developing the first resist film; forming a first mask pattern by etching the mask material film with the first resist pattern used as a mask; removing the first resist pattern, after the forming the first mask pattern; forming a second resist film on the mask material film, after removing the first resist pattern; forming a second resist pattern by transferring the second photomask pattern formed on the second photomask to the second resist film and developing the second resist film; forming a second mask pattern by etching the mask material film with the second resist pattern used as a mask; removing the second resist pattern, after forming the second mask pattern; and forming a first film pattern by etching the first film with the second mask pattern used as a mask, after removing the second resist pattern, the writing pattern data generating method comprising: correcting the first pattern data in accordance with a first formation change difference between the first film pattern and the second mask pattern which is produced dependent upon the pattern arrangement of the second mask pattern and a second formation change difference between the second resist pattern and the second mask pattern which is produced dependent upon the pattern arrangement of the second resist pattern.

In another aspect of the present invention, there is provided a method for manufacturing a semiconductor device, comprising the steps of: preparing a first photomask with a first photomask pattern formed thereon; preparing a second photomask with a second photomask pattern formed thereon; forming a mask material film on a first film; forming a first resist film on the mask material film; forming a first resist pattern by transferring the first photomask pattern to the first resist film and developing the first resist film; forming a first mask pattern by etching the mask material film with the first resist pattern used as a mask; removing the first resist pattern, after forming the first mask pattern; forming a second resist film on the mask material film, after removing the first resist pattern; forming a second resist pattern by transferring the second photomask pattern to the second resist film and developing the second resist film; forming a second mask pattern by etching the mask material film with the second resist pattern used as a mask; removing the second resist pattern, after forming the second mask pattern; and forming a first film pattern by etching the first film with the second mask pattern used as a mask, after removing the second resist pattern, wherein the first photomask pattern is formed in accordance with first writing pattern data, the first writing pattern data is generated from a first pattern data, and, in order to generate the first writing pattern data, the first pattern data is corrected in accordance with a first formation change difference between the first film pattern and the second mask pattern which is produced dependent upon the pattern arrangement of the second mask pattern and a second formation change difference between the first mask pattern and the first resist pattern which is produced dependent upon the pattern arrangement of the first resist pattern.

In another aspect of the present invention there is provided a method for manufacturing a semiconductor device comprising the steps of: preparing a first photomask with a first photomask pattern formed thereon; preparing a second photomask with a second photomask pattern formed thereon; forming a mask material film on a first film; forming a first resist film on the mask material film; forming a first resist pattern by transferring the first photomask pattern to the first resist film and developing the first resist film; forming a first mask pattern by etching the mask material film with the first resist pattern used as a mask; removing the first resist pattern, after forming the first mask pattern; forming a second resist film on the mask material film, after the removing the first resist pattern; forming a second resist pattern by transferring the second photomask pattern to the second resist film and developing the second resist film; forming a second mask pattern by etching the mask material film with the use of a mask of the second resist pattern; removing the second resist pattern, after forming the second mask pattern; and forming a first film pattern by etching the first film with the second mask pattern used as a mask, after removing the second resist pattern; wherein the second photomask pattern is formed in accordance with the second writing pattern data, the second writing pattern data is generated from the second pattern data and, in order to generate the second writing pattern data, the first pattern data is corrected in accordance with a first formation change difference between the first film pattern and the second mask pattern which is produced dependent upon the pattern arrangement of the second mask pattern and a second formation change difference between the second mask pattern and the second resist pattern which is produced dependent upon the pattern arrangement of the second resist pattern.

BRIEF DESCRIPTION OF THE SEVERAL VIEWS OF THE DRAWING

FIG. 1 is a plan view showing an arrangement of a gate connection pattern according to a first embodiment of the present invention;

DETAILED DESCRIPTION OF THE INVENTION

Figure 2:
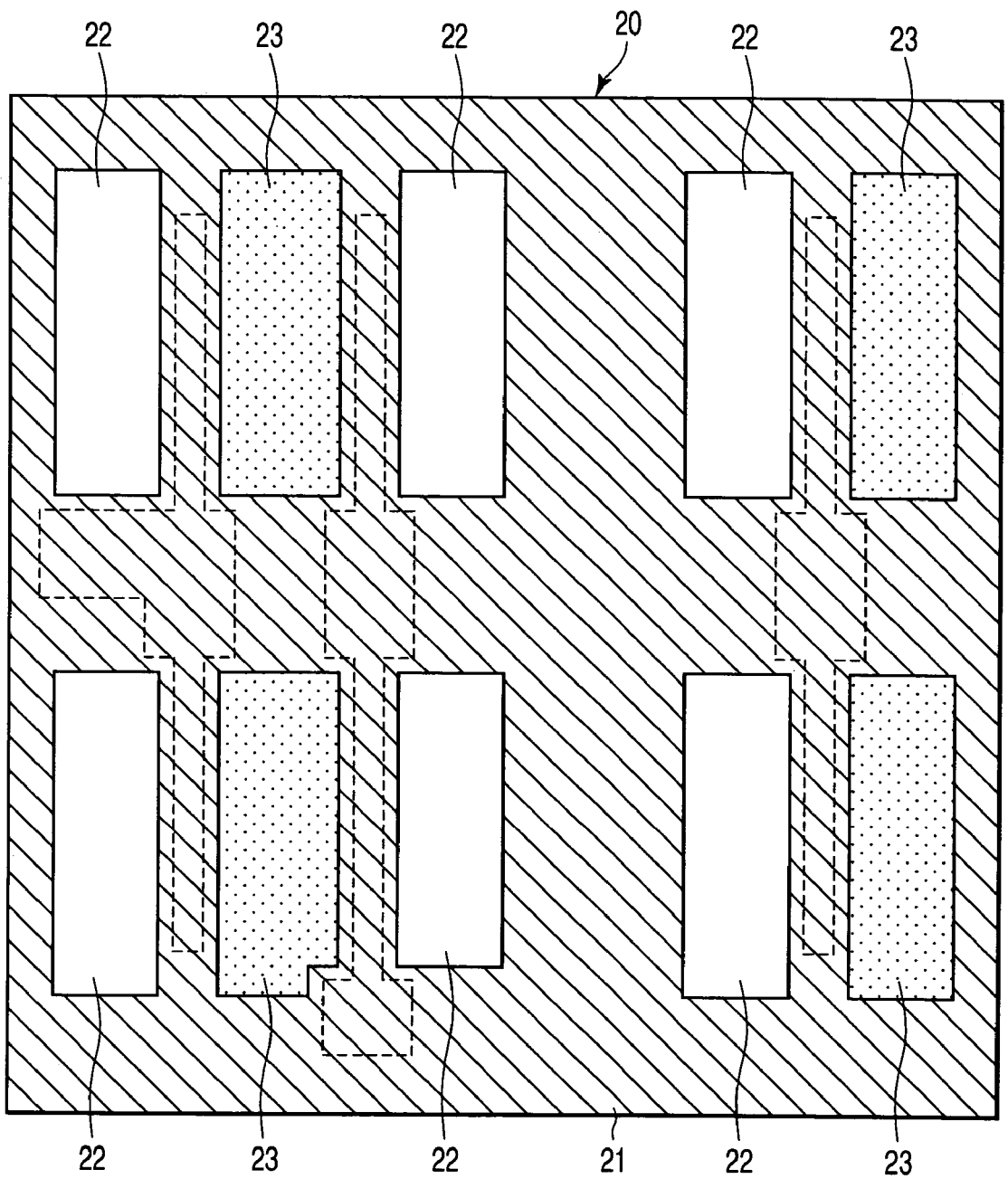
FIG. 2 is a plan view showing an arrangement of an alternating phase shift mask relating to the first embodiment.

With reference to the drawing, explanation will be made below about the embodiments of the present invention.

First Embodiment

FIG. 1 is plan view showing a structure of a gate connection pattern according to a first embodiment of the present invention. In FIG. 1, reference numeral 11 represents a gate section of a gate length 30 nm, 12, an interconnection section of a width 140 nm, and 13, a contact pad section.

Figure 3:
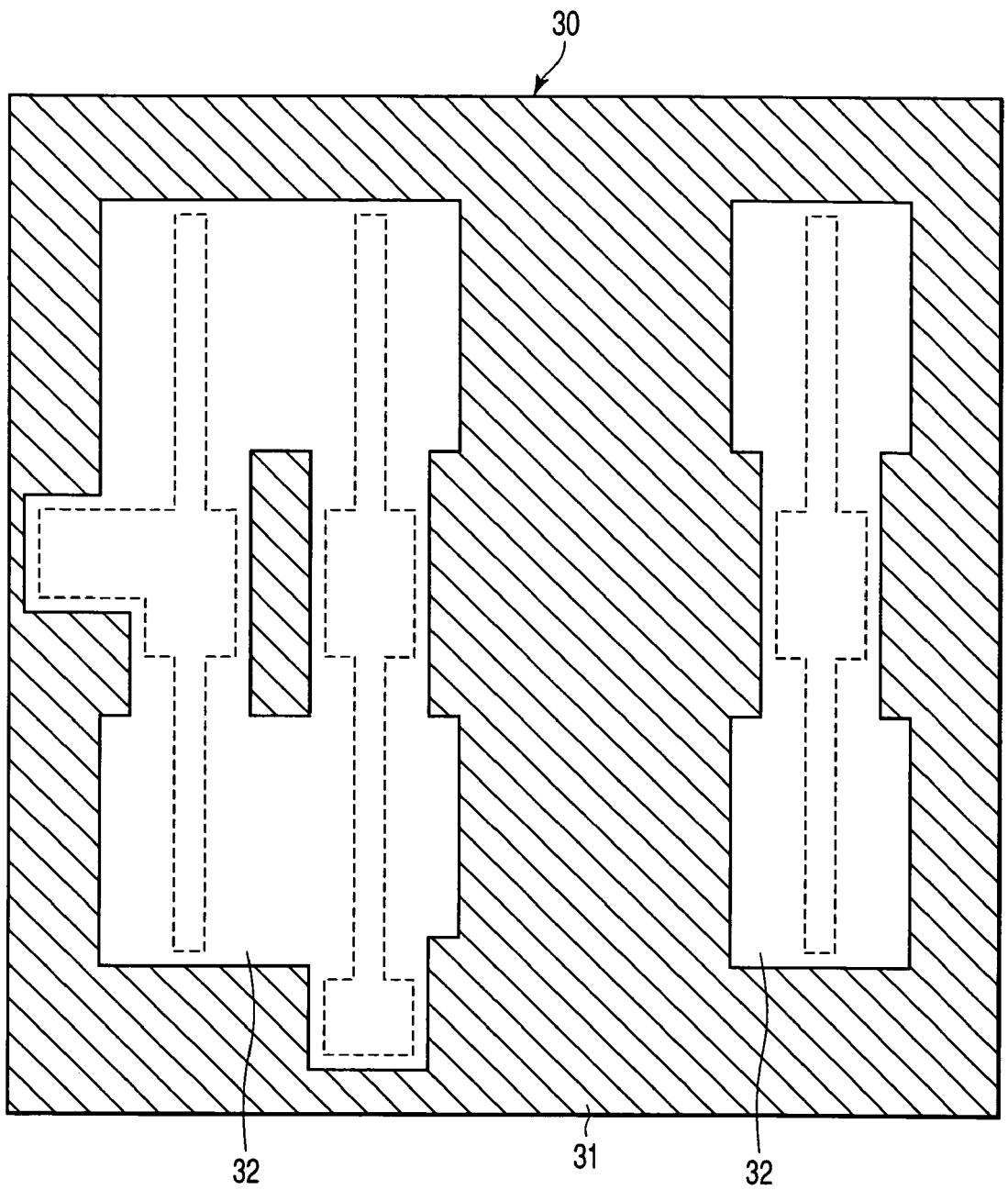
FIG. 3 is a plan view showing an arrangement of a trimming mask according to the first embodiment.

Let it be supposed that the pattern shown in FIG. 1 is formed by a patterning process using a double exposure as set out in connection with the conventional technique. In order to affect a double exposure, use is made of an alternating phase shift mask (first photomask) 20 shown in FIG. 2 and a trimming mask 30 shown in FIG. 3. It is to be noted that, as the trimming mask (second photomask) use may be made of a halftone type phase shift type photomask. In an etching step following the formation of a mask using the two masks, gate electrodes are formed each having a different pattern at a respective edge portions. In FIG. 2, reference numeral 21 represents a light shielding section and 22, 23, openings. Light passing through the opening 23 has a 180° phase difference with respect to light passing through the opening 22. In FIG. 3, reference numeral 31 represents a phase shift portion and 32, openings. The respective pattern shown in FIG. 1 is shown in broken line in FIGS. 2 and 3.

Figure 6:
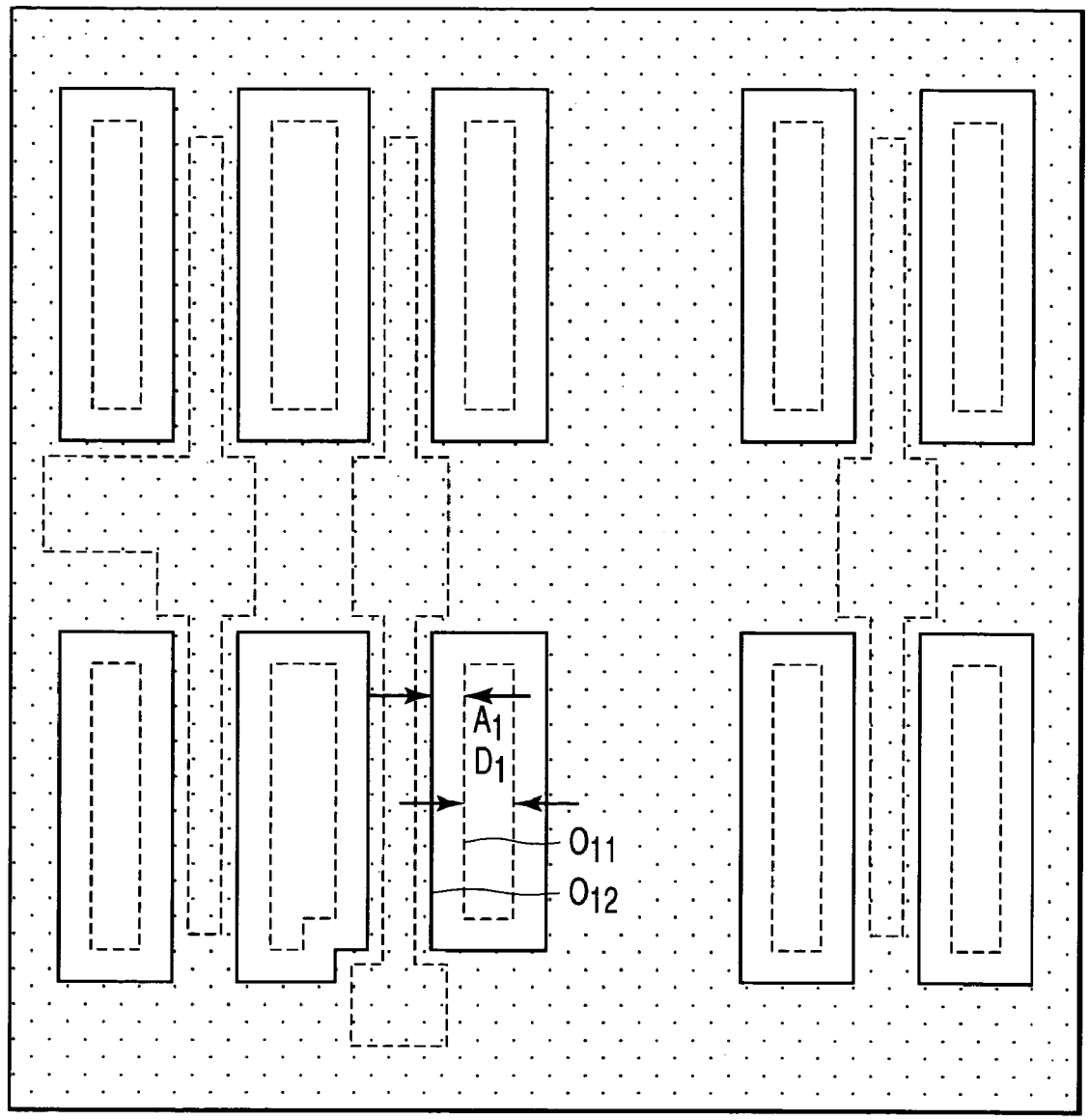
FIG. 6 is a plan view showing the manufacturing step of the gate connection pattern shown in FIG. 1.
Figure 7:
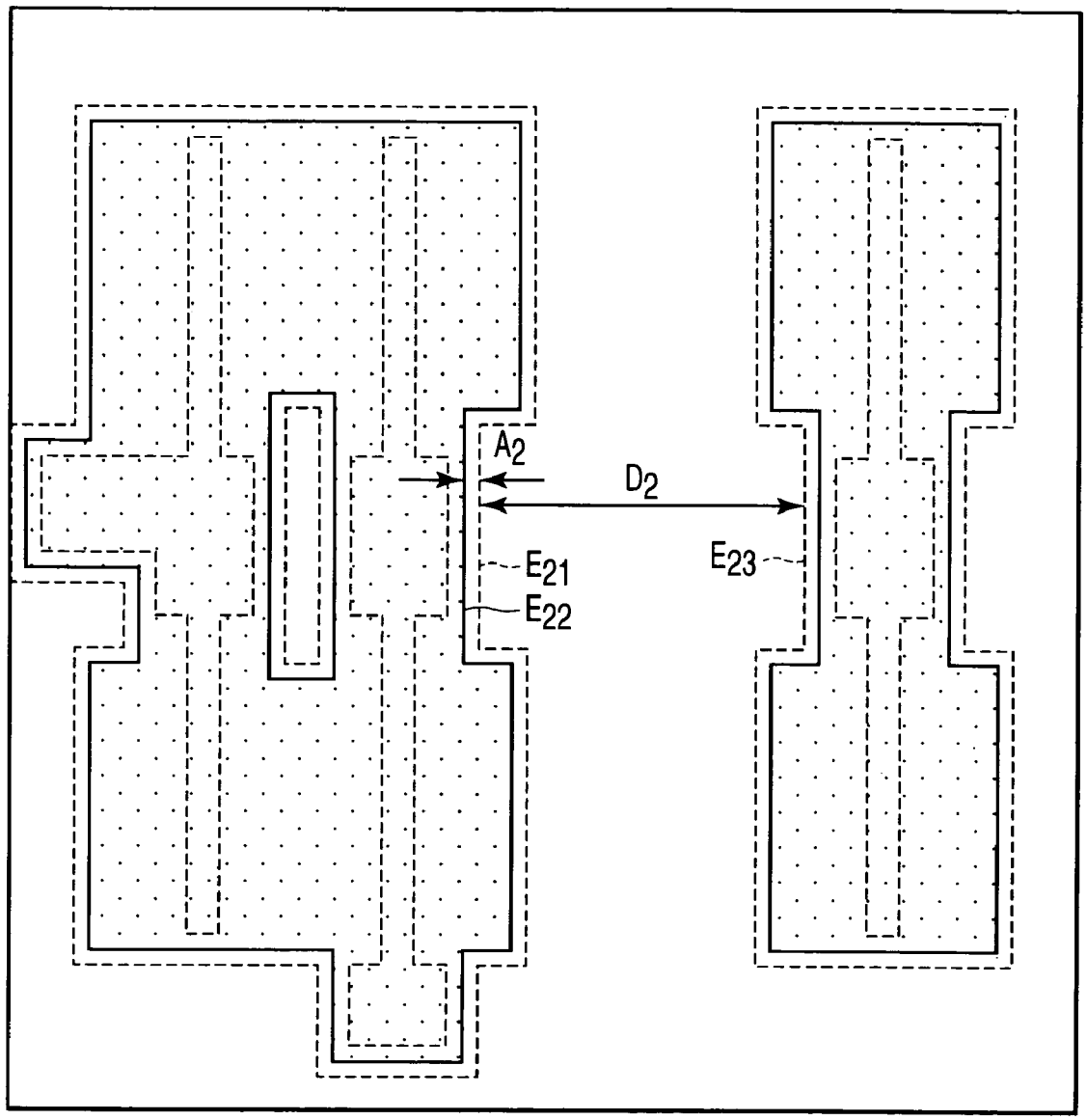
FIG. 7 is a plan view showing the manufacturing step of the gate connection pattern shown in FIG. 1.
Figure 8:
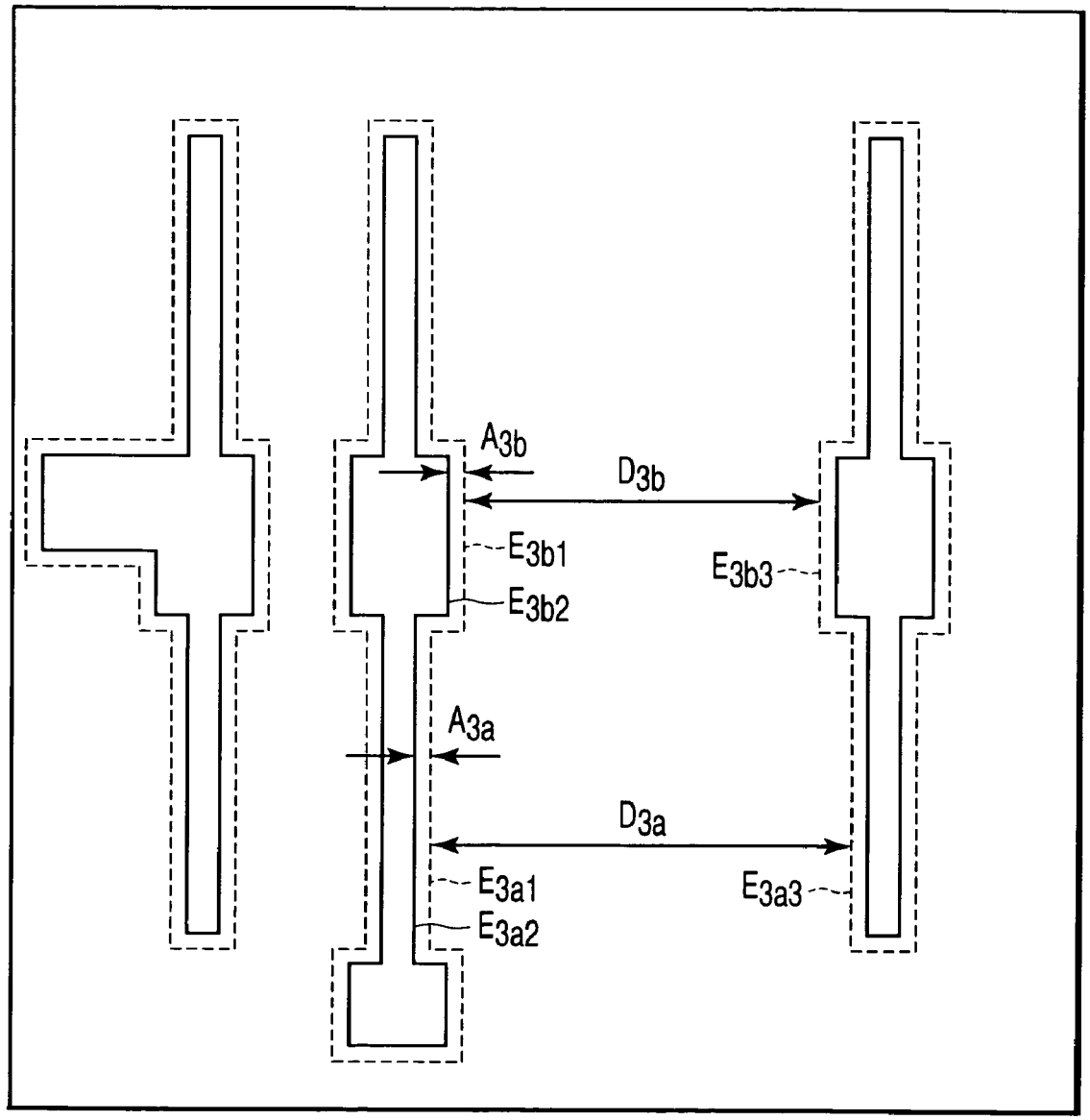
FIG. 8 is a plan view showing the manufacturing step of the gate connection pattern shown in FIG. 1.

With reference to FIGS. 4A to 4K, 5A to 5K and 6 to 8, explanation will be made below about a manufacturing method of a semiconductor device according to the first embodiment of the present invention. FIGS. 4A to 4K are cross-sectional views corresponding to an IA-IA' area in FIG. 1, while, on the other hand, FIGS. 5A to 5K are cross-sectional views corresponding to an IB-IB' area in FIG. 1. FIGS. 6, 7 and 8, each, show a plan view.

Figure 4A:
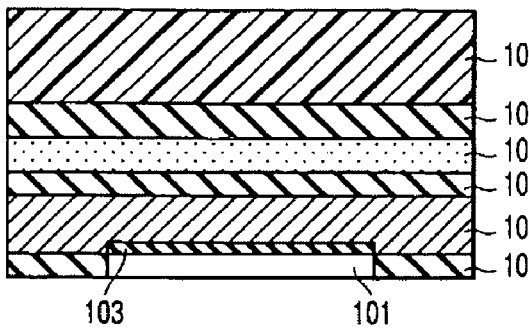
FIGS. 4A to 4K are cross-sectional views showing the manufacturing steps of the gate connection pattern shown in FIG. 1.
Figure 5A:
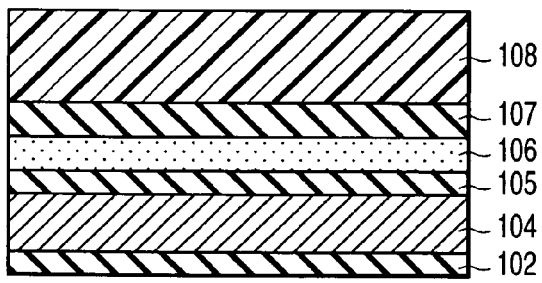
FIGS. 5A to 5K are cross-sectional views showing the manufacturing steps of the gate connection pattern shown in FIG. 1.

As shown in FIGS. 4A and 5A, a gate insulating film 103 is formed by a thermal oxidation method on an Si substrate having an element area 101 and element isolation area 102 and, after this, an SiGe film 104 is deposited as a gate electrode material film on the gate insulating film 103 by virtue of a chemical vapor deposition (CVD) method, etc. Then, a TEOS film (mask material film, hard mask film) 105 and a-Si (amorphous silicon) film (mask material film, hand mask material film) 106 are deposited on the gate electrode material film, respectively, by the CVD method and sputtering method. Then an anti-reflection film (mask material film) 107 and first resist film 108 are coated/baked on the a-Si film 106.

Figure 4B:
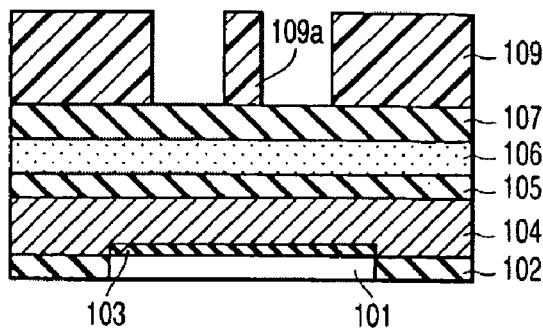
Figure 5B:
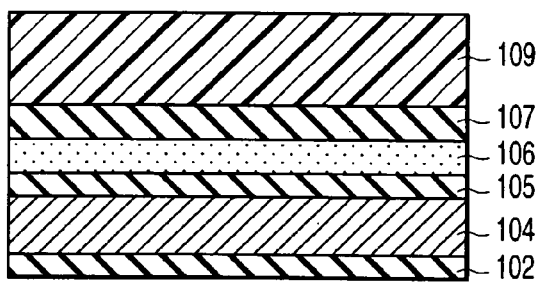

Then, as shown in FIGS. 4B and 5B, a latent image is formed on the first resist film 108 by virtue of a light exposure using the alternating phase shift mask 20 shown in FIG. 2 and, after it is developed, a first resist pattern 109 is formed. As this hard mask material film use may be made of not only the TEOS film and a-Si film but also the TEOS film, a-Si film, SiON film, Si$_3$N$_4$ film either singly or in combination. Further, use is also made of Al$_2$O$_3$, SiC, carbon film and organic film, either singly or in combination, acting as an optional anti-reflection film from an underlying film.

Figure 4C:
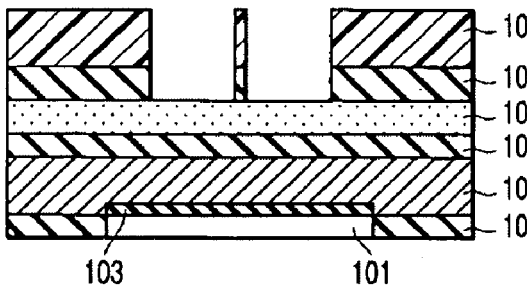
Figure 5C:
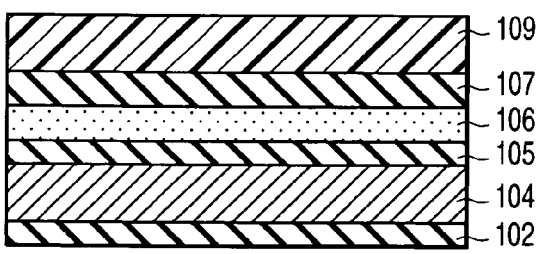

Then, as shown in FIGS. 4C and 5C, the anti-reflection film 107 is reactive ion etched with the first resist pattern 109 used as a mask.

Figure 4D:
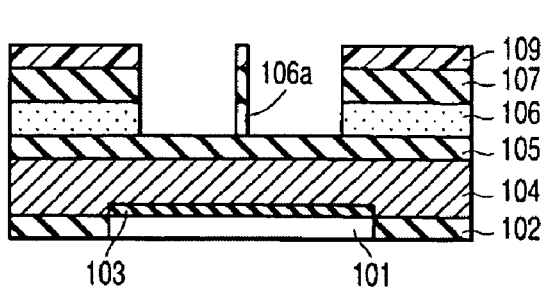
Figure 5D:
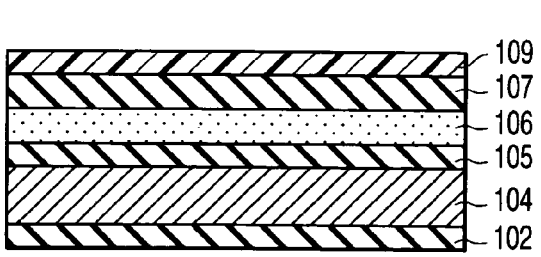

As shown in FIGS. 4D and 5D, the a-Si film 106 is reactive ion etched with the first resist pattern 109 used as a mask. Usually, the reactive ion etching is so done as to allow any change difference never to be made onto a pattern size after the formation of the associated film relative to the resist pattern. However, in this manufacturing step, the RIE condition is so intentionally adjusted as to allow the associated film to be formed to a smaller size, that is, to be slimmed. In this way, a pattern-like a-Si film 106a is formed at the gate portion.

Here, the a-Si film 106a is made smaller in width than the first resist pattern 109 to provide a formation change difference. Usually, the formation change difference (formation change difference including a slimmed formation) is produced in accordance with a formation area. The pattern environment at a formation time following the light exposure under the first alternating phase shift mask is, for example, as shown in FIG. 6. As in the case of FIG. 6, an opening pattern $O_{12}$ is formed relative to an originally forming resist opening pattern $O_{11}$. A formation change difference $A_1$ between the opening pattern $O_{12}$ and the resist opening pattern $O_{11}$ may be so considered as to vary in accordance with a depth $D_1$ of the resist opening pattern $O_{11}$. Accurately, the formation change difference depends not only upon the width $D_1$ but also the longitudinal length of the resist opening pattern in the Figure. In the present case, the dependence upon the length direction is considered to be smaller.

Figure 4E:
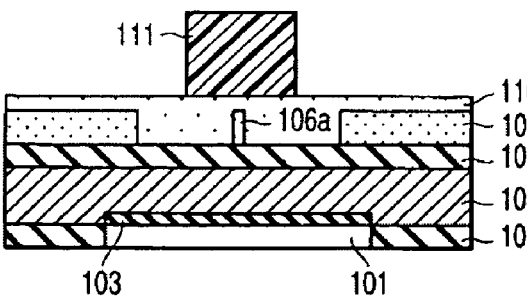
Figure 5E:
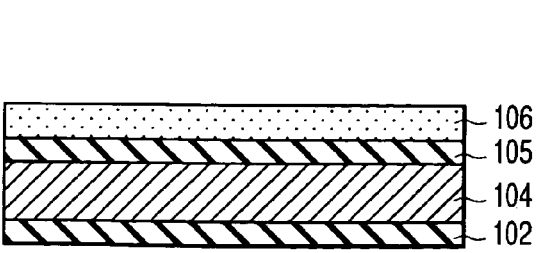

As shown in FIGS. 4E and 5E, the anti-reflection film 107 and first resist pattern 109 are removed.

Figure 4F:
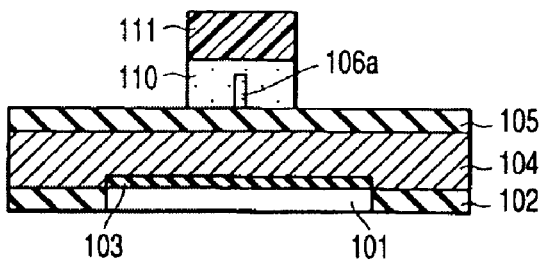
Figure 5F:
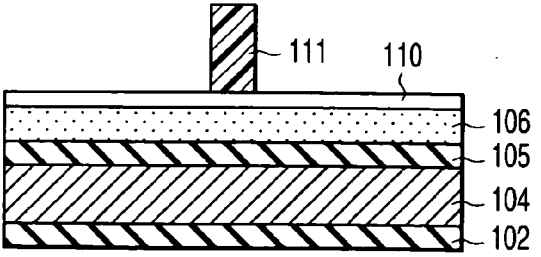

As shown in FIGS. 4F and 5F, after the formation of a second anti-reflection film 110 on the formed a-Si film 106, a resist agent is coated/baked to provide a second resist film. The second resist film is exposed/developed under a light exposure using the second mask (trimming mask) to provide a second resist pattern 111.

Figure 4G:
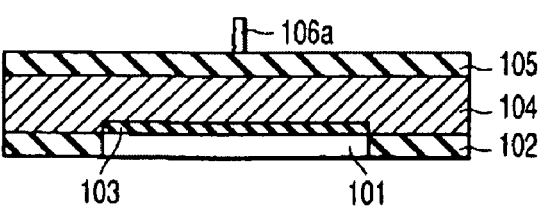
Figure 5G:
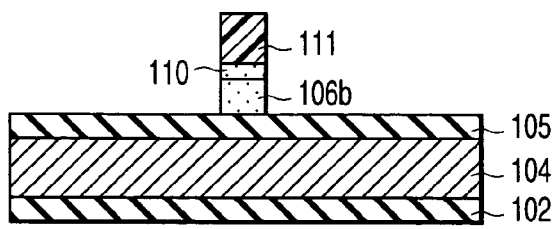

Then, as shown in FIGS. 4G and 5G, the second anti-reflection film 110 and a-Si film 106 are reactive ion etched with the second resist pattern 111 as a mask. FIG. 7 shows a plan view after the reactive ion etching. In FIG. 7, those areas surrounded by the broken lines correspond to areas matched to the second resist pattern while, on the other hand, those speckled areas correspond to remaining a-Si film 106 after the reactive ion etching. An edge E22 of the a-Si film 106 is formed relative to an originally forming edge E21 of the resist. A formation change difference $A_2$ between the edge E21 and the edge E22 may be regarded as varying in accordance with a distance $D_2$ between the edge E21 and the edge E23.

Here, in the first eight exposure and formation process, the a-Si film 106 is already formed and, in the formation process following the second light exposure, there is an area where the TEOS film 105 is exposed. The second formation process is done under the condition that the formed a-Si film 106 is further etched and the exposed TEOS film 105 is not etched. Further, at this step, a connection section is formed but, in this case, a condition is so adjusted that, relative to the resist pattern, the connection-to-connection pattern is made never to a possible greatest extent at a formed a-Si pattern.

Figure 4H:
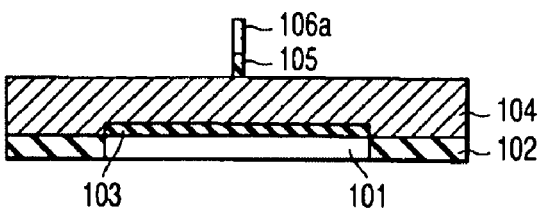
Figure 5H:
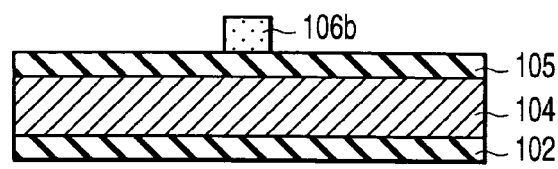

Then, as shown in FIGS. 4H and 5H, the second anti-reflection film 110 and second resist pattern 111 are removed.

Figures 4I, 4J:
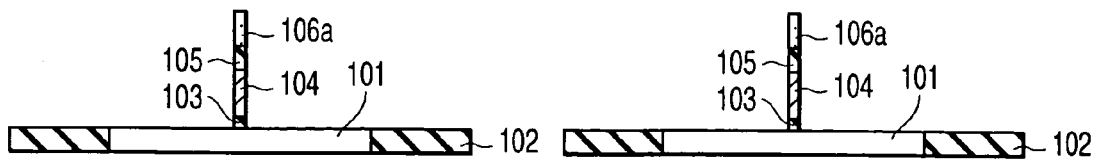
Figure 5I:
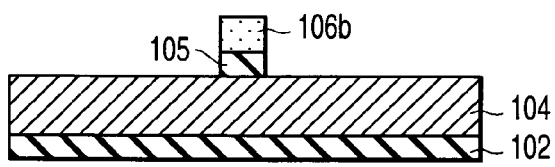
Figure 5J:
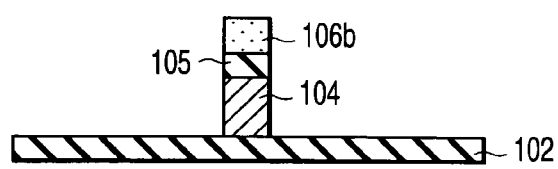

Then, the TEOS film 105 is reactive ion etched with the remaining a-Si film 106 used as a mask (FIGS. 4I and 5I). Further, the SiGe film 104 is reactive ion etched (FIGS. 4J and 5J). Here, when a pattern formed on the a-Si film 106 is transferred to the SiGe film 104, there occurs a formation change difference. Usually, the formation change difference is produced in accordance with a forming area. FIG. 8 shows a plan view after the formation of the reactive ion etching. In FIG. 8, those areas surrounded by the broken line correspond to those previously formed a-Si films 106 while, on the other hand, those areas surrounded by the solid lines correspond to those remaining portions of the SiGe film after the reactive ion etching. Relative to the edges $E_{3a1}$ and $E_{3b1}$ of those originally formed resist, edges $E_{3a2}$ and $E_{3b2}$ of the SiGe film 104 are formed. The formation change differences $A_{3a}$, $A_{3b}$ between the edges $E_{3a1}$, $E_{3b1}$ and edges $E_{3a2}$, $E_{3b2}$ may be regarded as varying in accordance with distances $D_{3a}$, $D_{3b}$ between the edges $E_{3a1}$, $E_{3b1}$ and the edges $E_{3a3}$, $E_{3b3}$.

The reason that the TEOS film is used is because it acts as an etching stopping film, never almost etched at the RIE time of the a-Si film, that is, can take a high select ratio relative to the a-Si film and also acts as a mask material, that is, can take a high select ratio relative to the SiGe film in the same way as at the RIE time of the SiGe film.

Figure 4K:
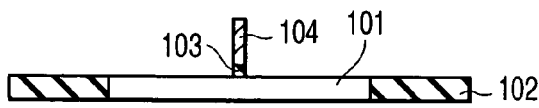
Figure 5K:
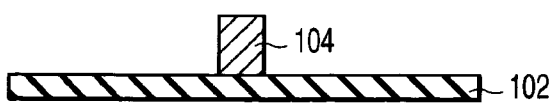

Finally, as shown in FIGS. 4K and 5K, the a-Si film and TEOS film are removed.

In order to obtain any desired dimensions of a gate section, interconnection section and contact pad section, correction is made as will be set out below. Here, the correction above means applying any correction to the first and second mask dimensions.

Figure 9:
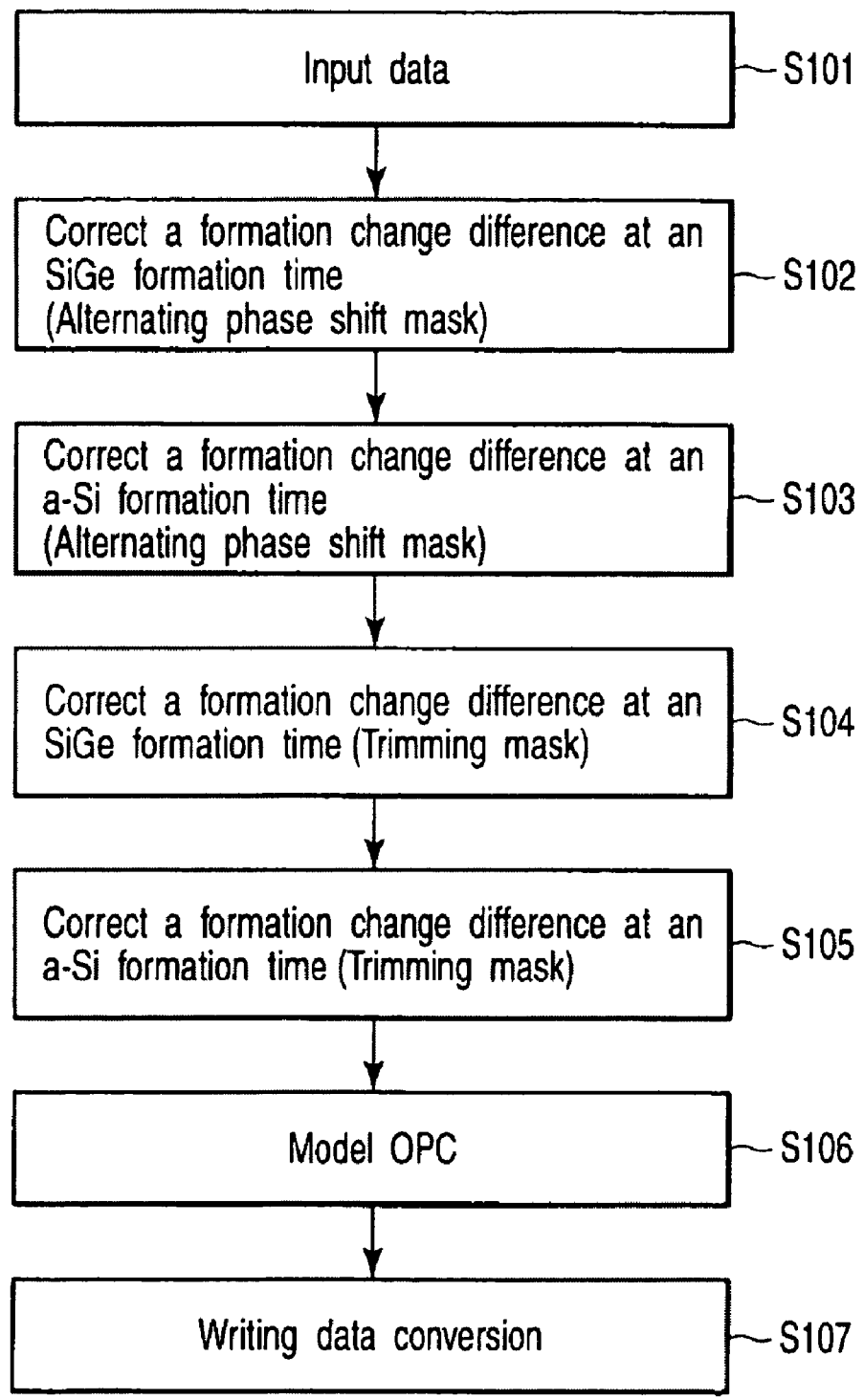
FIG. 9 is a flowchart showing a mask correction method according to the first embodiment.
Figure 10:
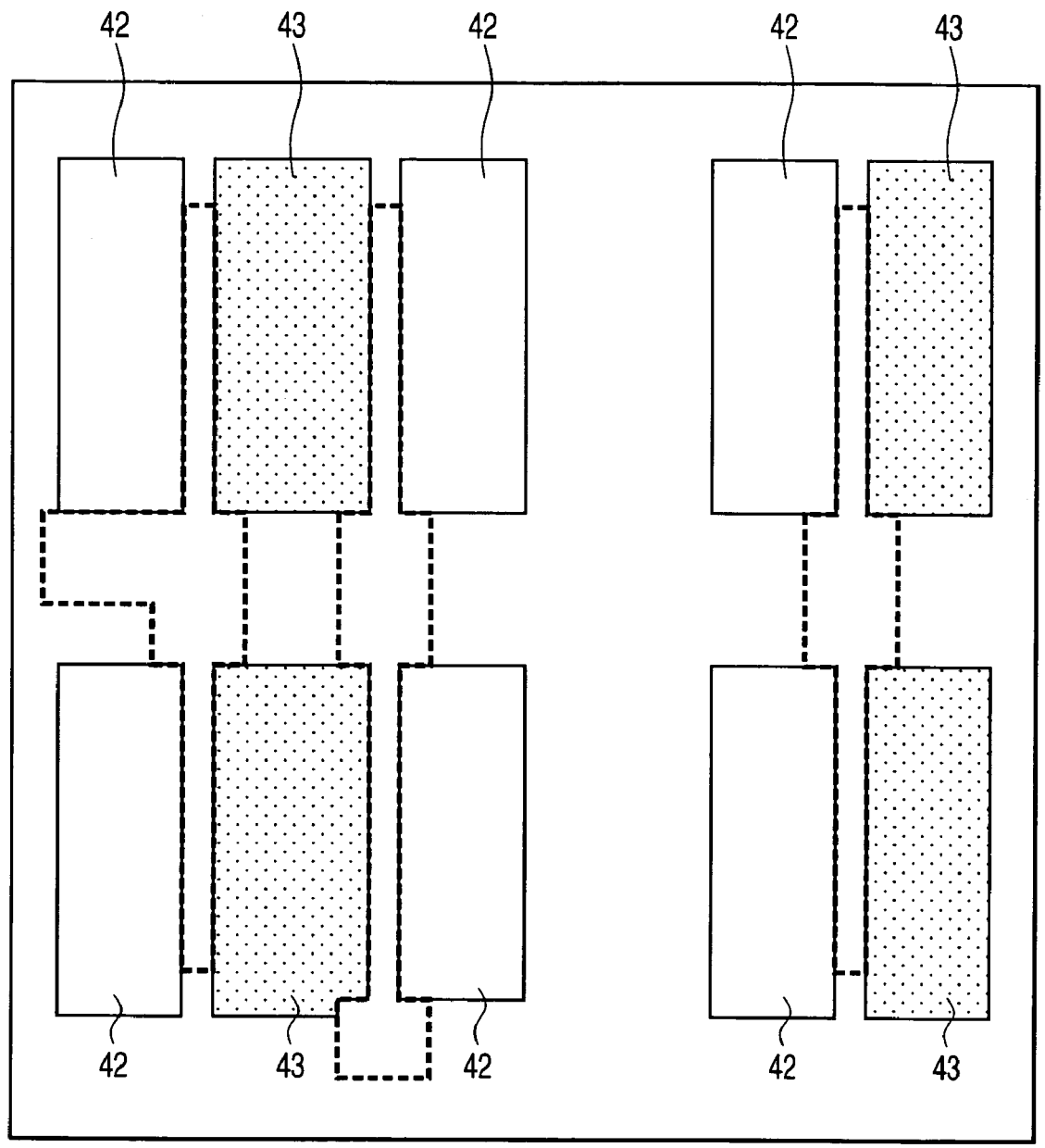
FIG. 10 is a view showing alternating phase shift mask data.
Figure 11:
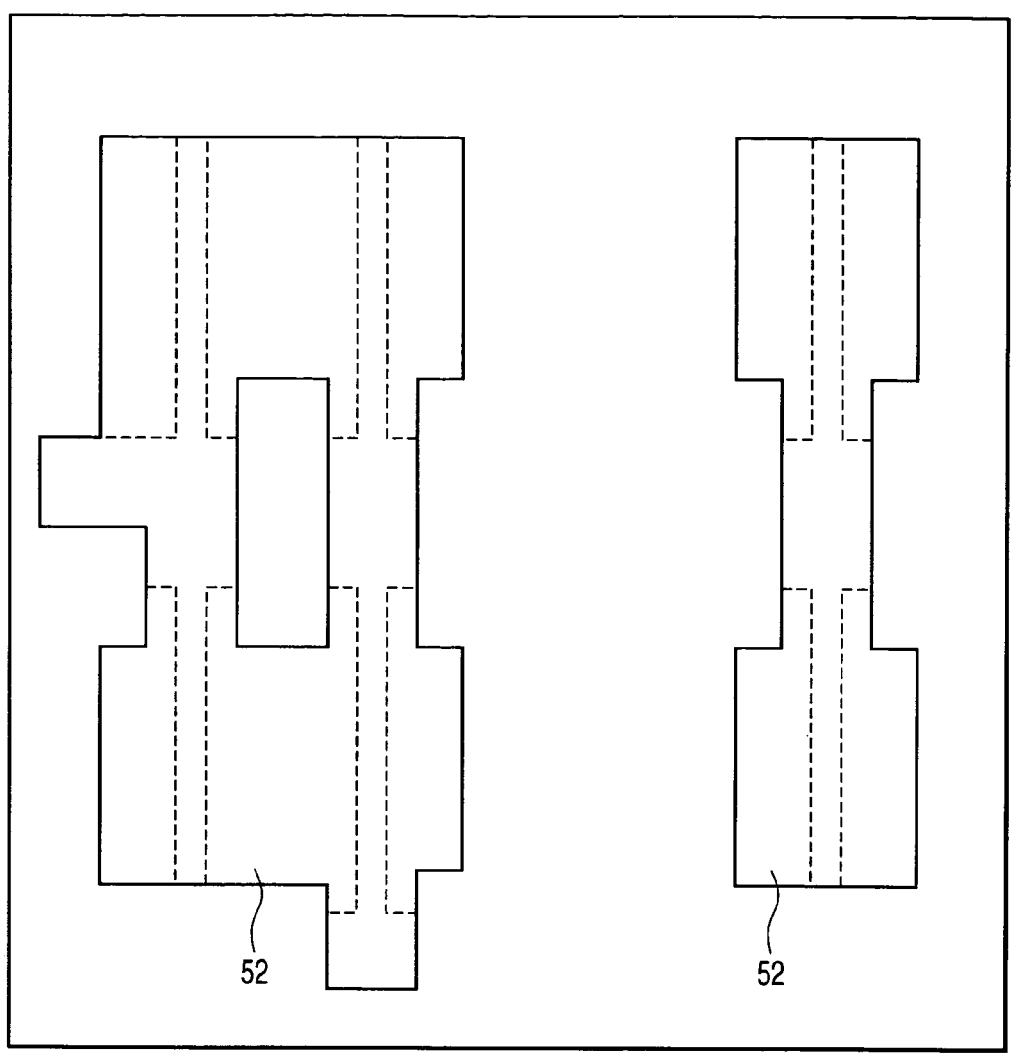
FIG. 11 is a view showing trimming mask data.

The method for correcting mask data will be explained below with the use of FIG. 9. First, input data is prepared (step S101). Here, the input data means data producing an opening of the alternating phase shift mask for forming a desired gate pattern and a trimming mask pattern (FIGS. 10 and 11). In the alternative phase shift mask data shown in FIG. 10, reference numerals 42, 43 represent opening areas. The light passing through the opening area 43 has a 180° phase difference relative to the light passing through the opening area 42. I the trimming mask data shown in FIG. 11, reference numeral 52 represents a light shielding area. In the mask data shown in FIGS. 10 and 11, a boundary between the opening area and the light shielding area contacts with a gate pattern.

Here, a different pattern environment is involved between a pattern at an etching step following a formation of a resist pattern with the use of the alternating phase shift mask and a pattern at an etching step following a formation of a resist pattern with the use of a trimming mask. Depending upon the respective pattern environment, correction is applied to the alternating phase shift mask and trimming mask.

Figure 12:
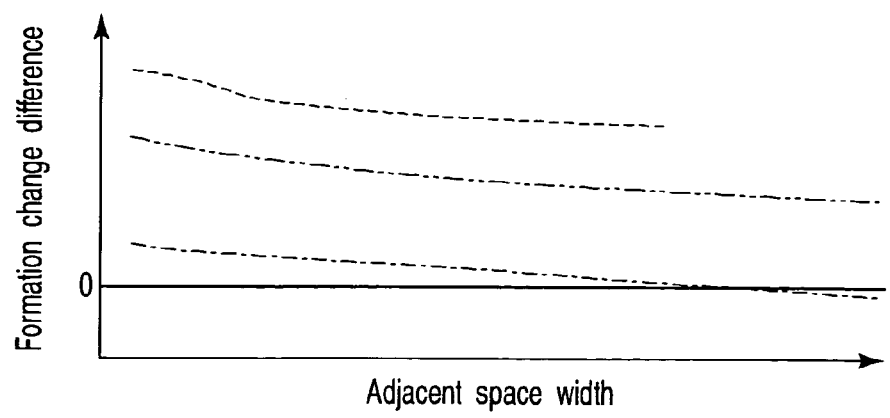
FIG. 12 is a view showing a pattern dependence of a formation change difference produced at a time of a formation with a first resist pattern used as a mask, a formation change difference produced at a time of a formation with a second resist pattern used as mask and a formation change difference produced at a time of forming an SiGe film with the a-Si film used as a mask.

FIG. 12 shows a pattern dependence among a formation change difference produced at a time of forming a first resist pattern as a mask, a formation change difference produced at a time of forming a second resist pattern as a mask and a formation change difference produced at a time of forming an SiGe film with the a-Si film used as a mask. In FIG. 12, the broken line represents the pattern dependence of the formation change difference of the a-Si film formed with the first resist pattern used as a mask. The dot-dash line represents the pattern dependence of the formation change difference of the SiGe film formed with the a-Si film used as a mask. The double-dot dash line represents the pattern dependence of the formation change difference of the a-Si film formed with the second resist pattern used as a mask.

Figure 13:
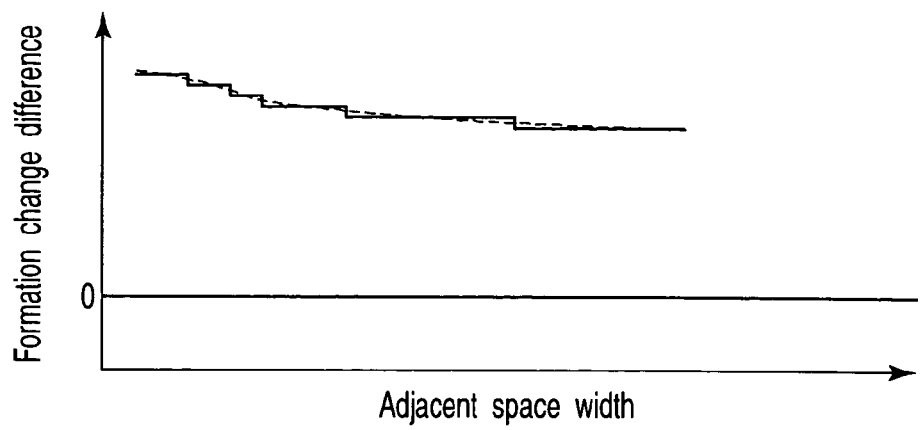
FIG. 13 is a view showing a stepped-like correction value corresponding to a distance between opposite edges of an opening pattern of the first resist pattern.
Figure 14:
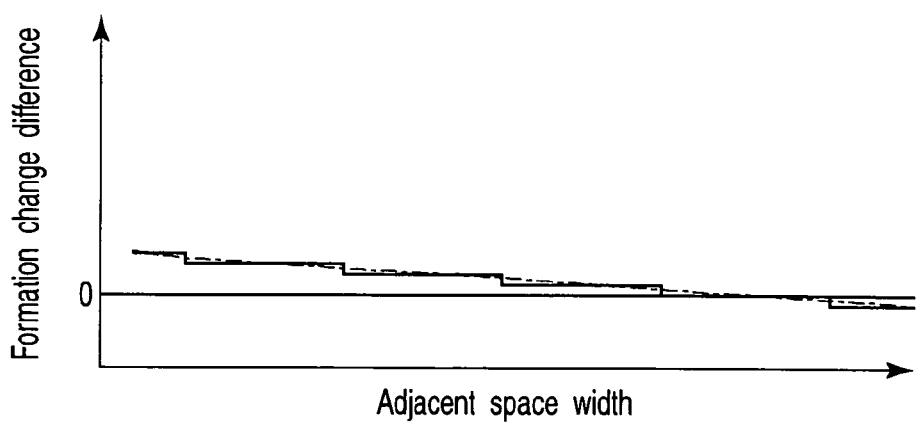
FIG. 14 is a characteristic diagram showing a stepped-like correction value, corresponding to a distance to an adjacent pattern, which corrects the formation change difference produced at a time of forming the SiGe film with the a-Si film used as a mask.
Figure 15:
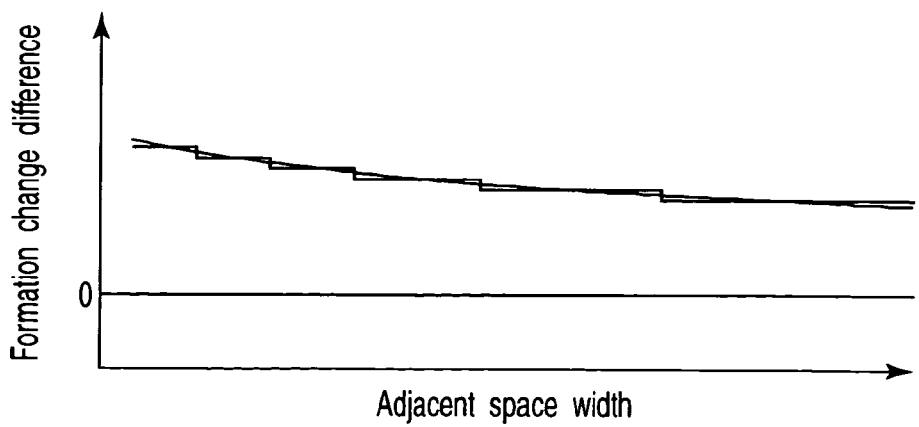
FIG. 15 is a characteristic diagram showing a stepped-like correction value, corresponding to a distance to an adjacent pattern, which corrects a formation change difference produced at a time of forming the a-Si film with a second resist pattern as a mask.

The formation change difference produced at a time of a film formation using the first resist pattern as a mask is corrected by applying stepped-like correction values corresponding to a distance between those opposite edges of the opening pattern as shown in FIG. 13. The formation change difference produced at a time of forming the SiGe film using the Si film as a mask is corrected by applying stepped-like correction values corresponding to a distance to a neighboring pattern as shown in FIG. 14. The formation change difference produced at a time of forming an a-Si film using the second resist pattern as a mask is corrected by applying stepped-like correction values corresponding to a distance to a neighboring pattern as shown in FIG. 15.

These correction values are listed in Tables 1, 2 and 3. Table 1 shows the stepped-like correction values for correcting the first resist pattern corresponding to the distance between the opposite edges of the opening pattern. Table 2 shows correction values corresponding to a distance to a neighboring pattern to correct the formation change difference produced at a time of forming the SiGe film using the a-Si film as a mask. Table 3 shows correction values corresponding to a distance to a neighboring pattern to correct the formation change difference produced at a time of forming an a-Si film using the second resist pattern as a mask.

TABLE 1

| Dc2 [nm] | Bias level [nm] |
|---|---|
| S < 160 | 30 |
| 160 ≦ S < 240 | 29 |
| 240 ≦ S < 290 | 28 |
| 290 ≦ S < 440 | 27 |
| 440 ≦ S < 740 | 26 |
| 740 ≦ S | 25 |

TABLE 2

| Dc1 [nm] | Bias level [nm] |
|---|---|
| S < 160 | 4 |
| 160 ≦ S < 440 | 3 |
| 440 ≦ S < 290 | 2 |
| 290 ≦ S < 720 | 1 |
| 720 ≦ S < 1350 | 0 |
| 1350 ≦ S | −1 |

TABLE 3

| Dc3 [nm] | Bias level [nm] |
|---|---|
| S < 190 | 16 |
| 190 ≦ S < 460 | 15 |
| 460 ≦ S < 660 | 14 |
| 660 ≦ S < 9 60 | 13 |
| 960 ≦ S < 1350 | 12 |
| 1350 ≦ S | 11 |

The bias level in Tables 1 to 3 displays an etching receding direction as being +.

Figure 16:
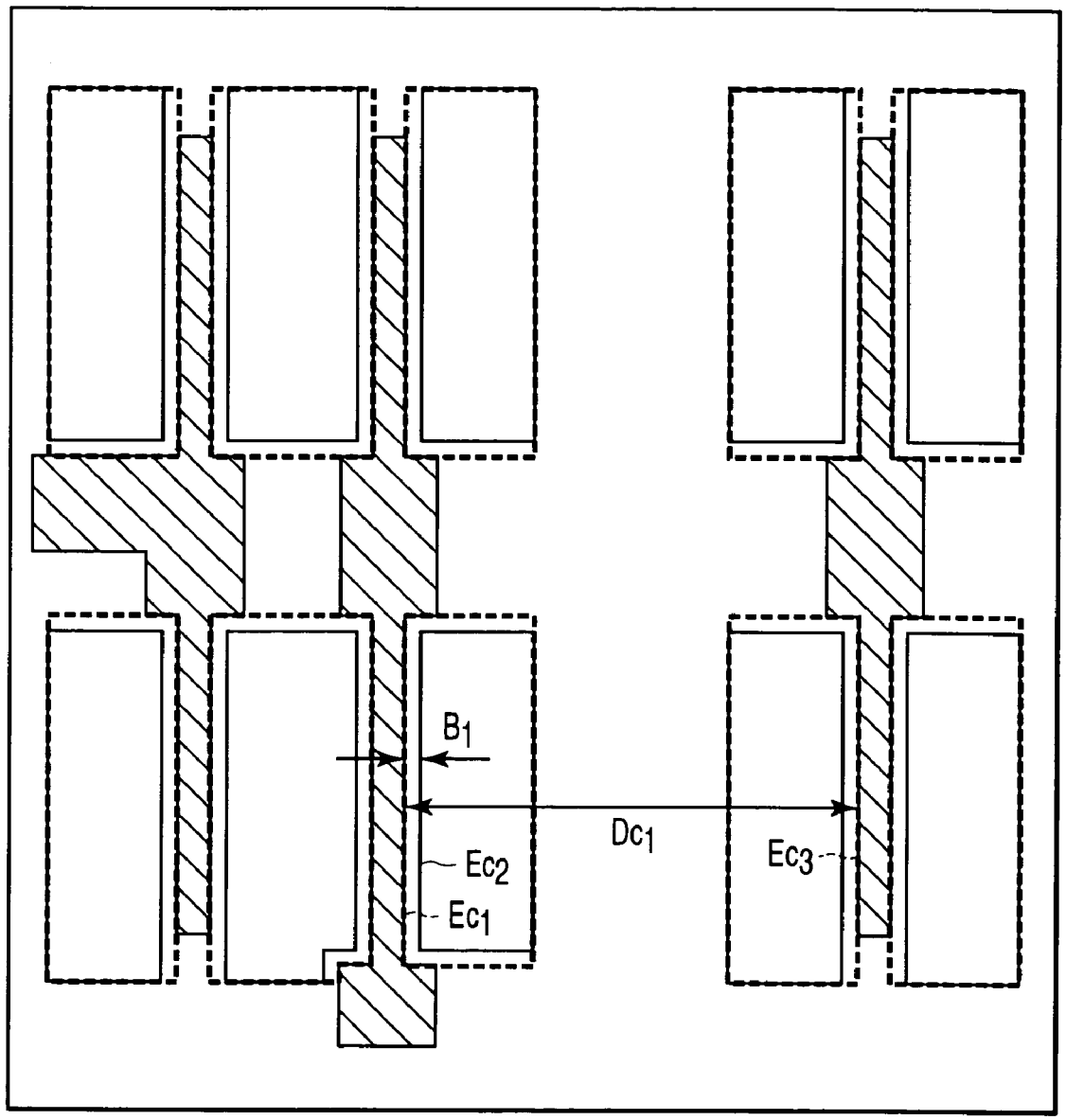
FIG. 16 is a view for explaining the correction of an alternating phase shift mask which is made for correcting a formation change difference produced at a time of forming the SiGe film with the a-Si film used as a mask.

First, correction is applied to the formation change difference produced at a time of forming the SiGe film using the a-Si film as a mask on an area which is formed using the alternating phase shift mask (step S102). The correction table shown in FIG. 14 and Table 2 is prepared. A space $Dc_1$ between a correction target edge $Ec_1$ and a neighboring gate pattern edge $Ec_3$ is measured. A correction value $B_1$ is determined from the measured value $Dc_1$ and contents in Table 2. As shown in FIG. 16, the correction target edge $Ec_1$ is receded by a correction value $B_1$ to obtain a correction target edge $Ec_2$.

Figure 17:
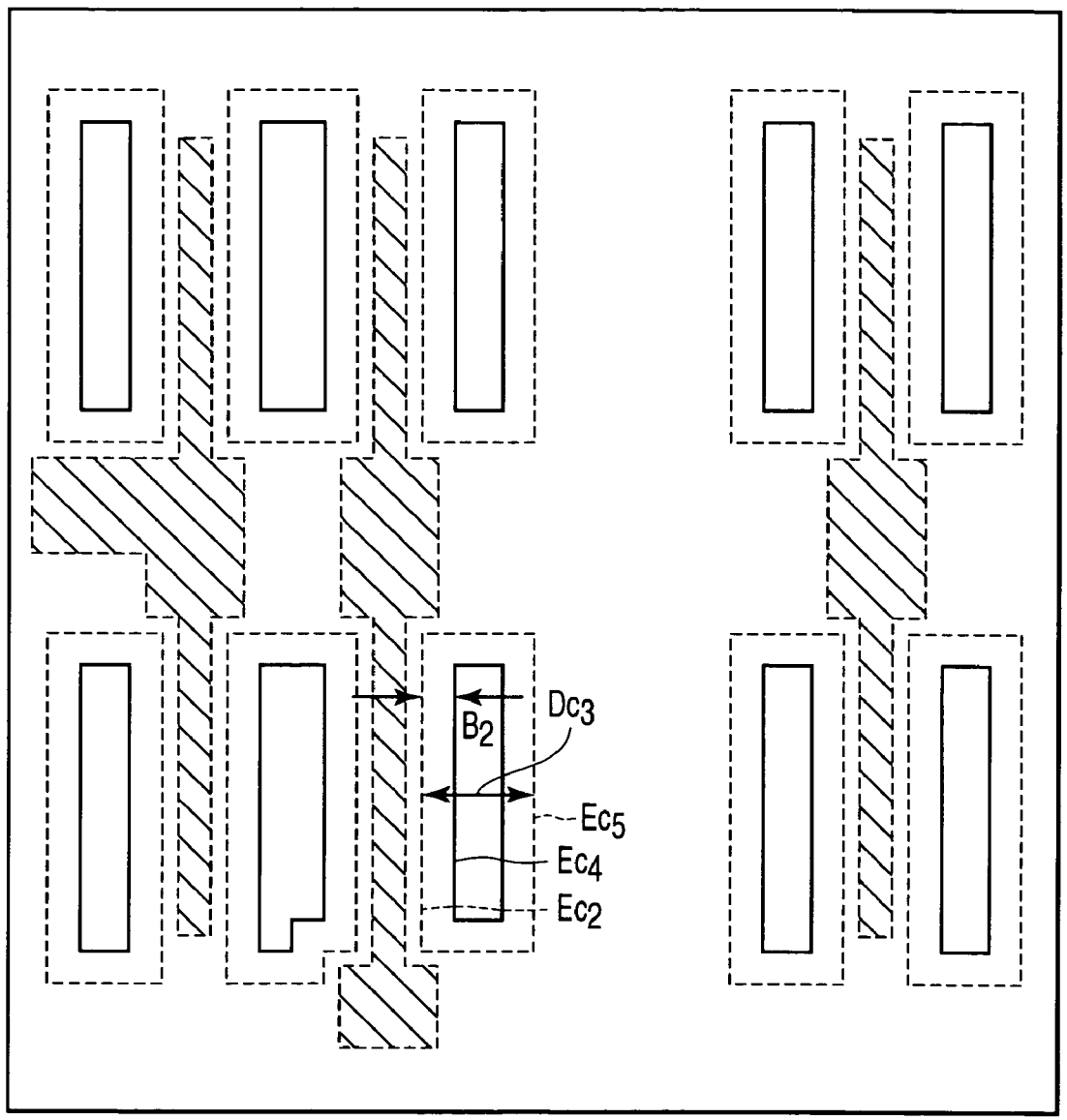
FIG. 17 is a view for explaining the correction of the alternating phase shift mask which is made for correcting a formation change difference produced in the a-Si film with the alternating phase shift mask as a mask.

Then correction is applied to a formation change difference produced at a time of forming an a-Si film using an alternating phase shift mask as a mask (step S103). A correction table shown in FIG. 13 and Table 1 are prepared and a distance between a correction target edge $Ec_2$ and a neighboring edge $Ec_4$ of an alternating phase shift mask's space pattern is measured. And a correction value $B_2$ is determined from the measured value $Dc_2$ and contents of Table 1. As shown in FIG. 17 the correction target edge $Ec_2$ is receded by the corrected value $B_2$ to obtain a corrected target edge $Ec_4$.

Figure 18:
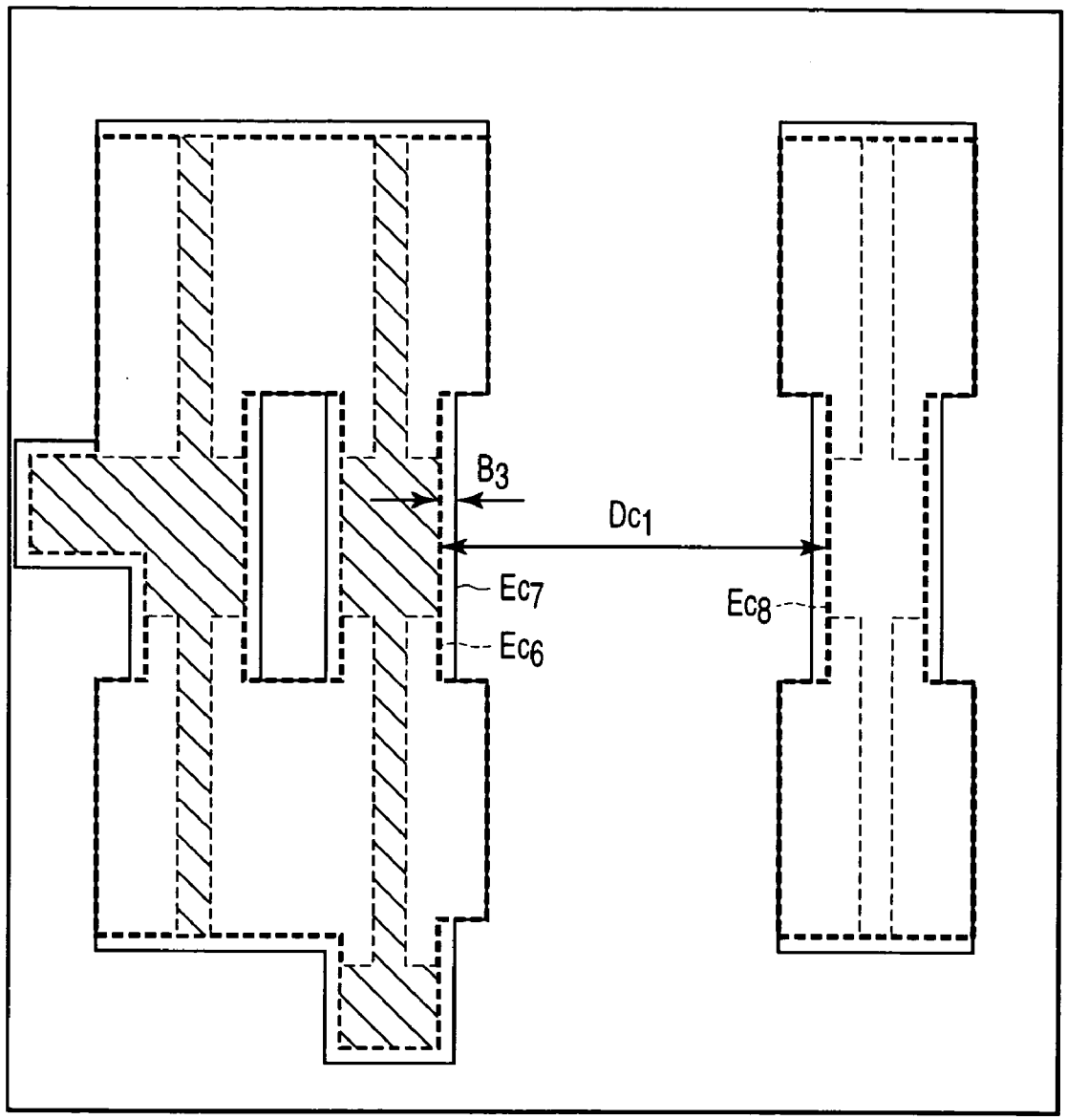
FIG. 18 is a view for explaining the correction of a trimming mask which is made for correcting a formation change difference produced at a time of forming the SiGe film with the a-Si film used as a mask.

Correction is applied to a formation change difference produced at a time of forming the SiGe film using an a-Si film as a mask on an area which is formed using the trimming mask (step S104). A correction table shown in FIG. 14 and Table 2 is prepared. A space $Dc_1$ between a correction target edge $Ec_6$ and an edge $Ec_8$ of a neighboring pattern is measured. A correction value $B_3$ is determined from the measured value $Dc_1$ and contents of Table 2. As shown in FIG. 18, the correction target edge $Ec_6$ is receded by the correction value $B_3$ to obtain a corrected target edge $Ec_7$.

Figure 19:
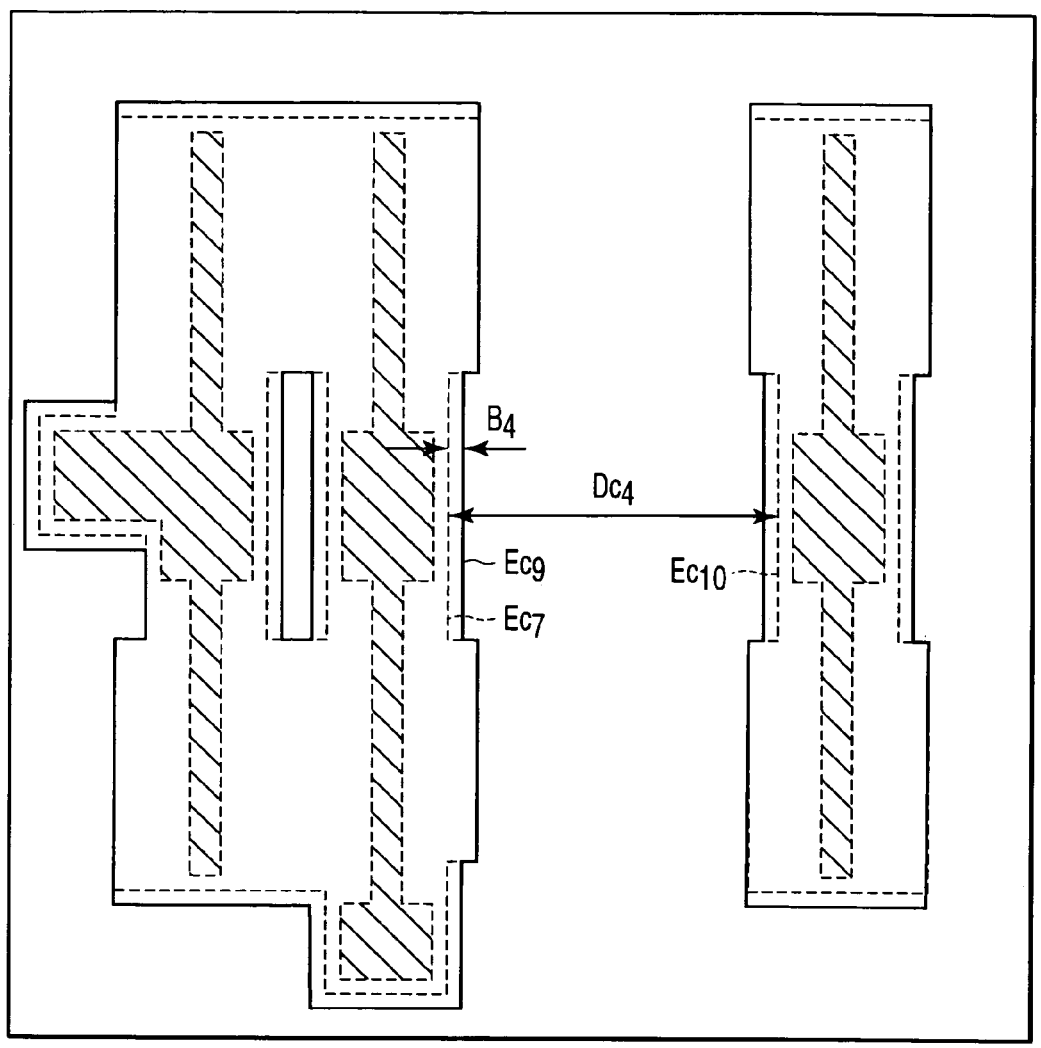
FIG. 19 is a view for explaining the correction of the alternating phase shift mask which is made for correcting a formation change difference produced in the a-Si film with a trimming mask used as a mask.

Then, correction is applied to a formation change difference produced at a time of forming an a-Si film using the second resist pattern as a mask which is formed by using the trimming mask (step S105). A correction table shown in FIG. 15 and Table 3 is prepared. A space $Dc_4$ between a correction target edge $Ec_7$ and an edge $Ec_{10}$ of a neighboring pattern is measured. A correction value $B_4$ is determined from the measured value $Dc_4$ and contents of Table 3. As shown in FIG. 19, the correction target edge $Ec_7$ is receded by the correction value $B_4$ to obtain a corrected target edge $Ec_9$.

Then, optical proximity correction is made at step S106. This is done separately from the correction of the formation change difference. Here, model OPC, that is, optical simulation is done and, based on this, pattern edge correction is made.

It is desirable that the optical proximity correction be individually done in order to enhance the accuracy of the gate dimension.

It may be done simultaneously with the optical proximity correction, provided that it involves a smaller formation change difference and an allowable gate dimension accuracy. Further, although this has been explained in connection with the model OPC, a rule-based OPC may be done, that is, a change difference between the mask dimension and the resist formation dimension on the wafer may be measured and correction table be prepared as in the case of the above-mentioned formation change difference and correction be made in accordance there width.

If, therefore, there exists any pattern dimension hard to obtain as a photomask after the model OPC has been made, it may be detected and corresponding enlarging processing be added to allow a mask value to be enlarged to a creatable size.

Finally, conversion is effected to write data for creating a mask (step S107) and, with the use of the write data, a mask pattern is written on a mask-blank.

After the process thus far explained with the use of FIGS. 4A to 4K and FIGS. 5A to 5K and FIGS. 6 to 8, an impurity is implanted into the Si substrate surface exposed with the above-mentioned gate pattern used as a mask, though being not shown, and, after forming a source/drain layer of a transistor, a known interlayer insulator is formed and a metal connection step, etc., is performed to complete an MOS transistor.

By correcting the respective pattern dependence of the formation change difference under a different pattern environment, it is possible to enhance the dimensional accuracy of a finally obtained pattern.

Although the present embodiment has been explained as being applied to the formation of a gate electrode material pattern by way of example, the present invention is not restricted thereto. The light exposing step using the alternating phase shift mask and light-exposing step using the trimming mask may be the reverse in their order. Further, generally, the gate electrode is classified into a PMOS and NMOS. Where the formation characteristics of both the gate electrode materials differ, it is desirable to apply individual corrected values according to the respective cases. Here, the individual value involved is applied to the correction value of the formation change difference of the SiGe film.

Second Embodiment

Where a space dependence of an a-Si film's formation change difference (hereinafter referred to as a first formation change difference) upon a first resist pattern for example is smaller, this embodiment is such that two corrections are made at a time.

Figure 20:
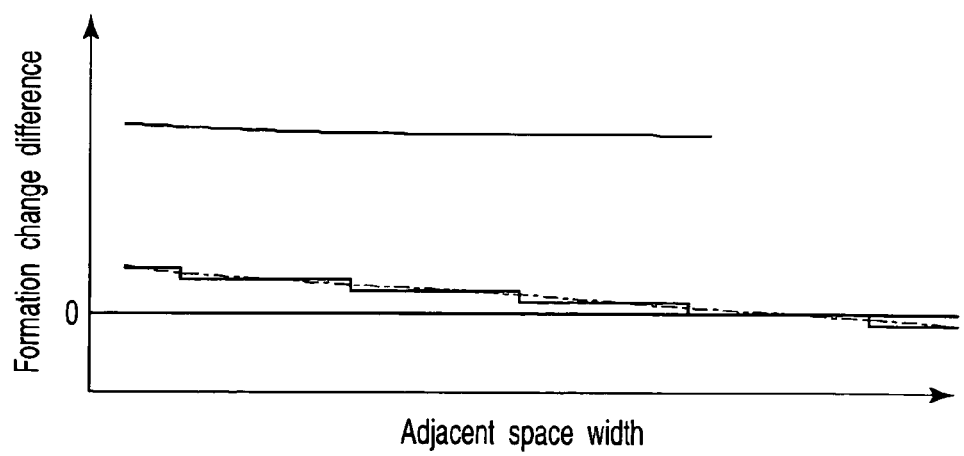
FIG. 20 is a view showing a space dependence of a formation change difference of the a-Si film upon a first resist pattern.

FIG. 20 shows the space dependence of the a-Si film's formation change difference upon the first resist pattern. Here, there is almost no difference between at smaller space dependence, that is, at a smaller space (in a case of a dense pattern) and at a greater space (in a case of an isolated pattern).

Where the formation change difference is allowable as a gate dimension accuracy (error), correction may be made by adding the correction value of the first formation change difference to the correction of the space dependence of an SiGe film's formation change difference (hereinafter referred to as a second formation change difference) upon the a-Si film.

That is, with an average value of those first formation change differences given by 1 nm, correction may be made by adding this value (1 nm) directly to the correction value of the second formation change difference.

Where, for example, the space dependence of the formation change difference at a first formation step is smaller, correction can be made by correcting the pattern dependences of those formation change differences produced at the first and second formation steps, that is, by doing these at a time. In this way, it is possible to improve the dimensional accuracy of a finally obtained pattern and hence to finish the processing in a short time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A writing pattern data generating method for, in order to form a first photomask for use in a manufacturing method of a semiconductor device, generating a first writing pattern data which allows a first photomask pattern to be written on a mask-blank from a first pattern data, the manufacturing method of the semiconductor device including forming a mask material film formed on a first film; forming a first resist film on the mask material film; forming a first resist pattern by transferring the first photomask pattern to the first resist film and developing the first resist film; forming a first mask pattern by etching the mask material film with the first resist pattern used as a mask; removing the first resist pattern, after forming the first mask pattern; forming a second resist film on the mask material film, after removing the first resist film; forming a second resist pattern by transferring a second photomask pattern which is formed on a second photomask to the second resist film and developing the second resist film, after removing the first resist pattern; forming a second mask pattern by etching the mask material film with the second resist pattern used as a mask, the second mask pattern including the first mask pattern; removing the second resist pattern, after forming the second mask pattern; and forming a first film pattern by etching the first film with a second mask pattern used as a mask, after removing the second resist pattern, the writing pattern data generating method comprising:

correcting the first pattern data in accordance with a first formation change difference between the first resist pattern and the first mask pattern formed by etching the mask material film with the first resist pattern used as a mask and a second formation chance difference between the first film pattern and the second mask pattern which is formed by etching the mask material and the film with the second resist pattern used as a mask, the second mask pattern including the first mask pattern.

2. A writing pattern data generating method according to claim 1, wherein the correcting comprises obtaining a first corrected pattern data by correcting the first pattern data correcting in accordance with the second formation change difference, and correcting the first corrected pattern data in accordance with the first formation change difference.

3. A writing pattern data generating method according to claim 1, wherein the first resist pattern has a pattern portion sandwiched by an adjacent pair of openings, and the width of the mask material film which is formed under the pattern portion at a time of forming the first mask pattern is made slimmer than that of the pattern portion.

4. A writing pattern data generating method according to claim 1, further comprising generating second writing pattern data for writing the second photomask pattern on the mask-blank so as to form the second photomask from second pattern data, the generating the second writing pattern data comprising correction made in accordance with a formation change difference between the first film and the second mask pattern which is produced dependent upon the pattern arrangement of the second mask pattern and a formation change difference between the second mask pattern and the second resist pattern which is produced dependent upon the pattern arrangement of the second resist pattern.

5. A writing pattern data generating method according to claim 1, wherein the first photomask is comprised of an alternating phase shift mask.

6. A writing pattern data generating method according to claim 1, wherein the second photomask is comprised of a half-tone phase shift mask.

7. A writing pattern data generating method for, in order to form a second photomask for use in a manufacturing method of a semiconductor device, generating a second writing pattern data which allows a second photomask pattern to be written on a mask-blank from a second pattern data, the manufacturing method of the semiconductor device including forming a mask material film formed on a first film; forming a first resist film on the mask material film; forming a first resist pattern by transferring a first photomask pattern which is formed on a first photomask to the first resist film and developing the first resist film; forming a first mask pattern by etching the mask material film with the first resist pattern used as a mask; removing the first resist pattern, after the forming the first mask pattern; forming a second resist film on the mask material film, after removing the first resist pattern; forming a second resist pattern by transferring the second photomask pattern formed on the second photomask to the second resist film and developing the second resist film; forming a second mask pattern by etching the mask material film with the second resist pattern used as a mask, the second mask pattern including the first mask pattern; removing the second resist pattern, after forming the second mask pattern; and forming a first film pattern by etching the first film with the second mask pattern used as a mask, after removing the second resist pattern, the writing pattern data generating method comprising:

correcting the first pattern data in accordance with a first formation change difference between the second resist pattern and the second mask pattern formed by etching the mask material film with the second resist pattern used as a mask and a second formation change difference between the first film pattern and the second mask pattern which is formed by etching the mask material film with the second resist pattern used as a mask, the second mask pattern including the first mask pattern.

8. A writing pattern data generating method according to claim 7, wherein the correcting comprises obtaining a first corrected pattern data by correcting the first pattern data in accordance with the second formation change difference, and correcting the first corrected pattern data in accordance with the first formation change difference.

9. A writing pattern data generating method according to claim 7, wherein the second photomask comprises an alternating phase shift mask.

10. A writing pattern data generating method according to claim 7, wherein the first photomask is comprised of a half-tone type phase shift mask.

* * * * *

UNITED STATES PATENT AND TRADEMARK OFFICE
CERTIFICATE OF CORRECTION

PATENT NO. : 7,399,557 B2  Page 1 of 1
APPLICATION NO. : 10/860138
DATED : July 15, 2008
INVENTOR(S) : Kanai It is certified that error appears in the above-identified patent and that said Letters Patent is hereby corrected as shown below:

Claim 1, column 10, line 61, change "chance" to --change--.

Signed and Sealed this

Sixteenth Day of September, 2008

JON W. DUDAS
*Director of the United States Patent and Trademark Office*